(12) United States Patent
Cao et al.

(10) Patent No.: US 10,608,019 B2
(45) Date of Patent: Mar. 31, 2020

(54) ARRAY SUBSTRATE, ITS MANUFACTURING METHOD, AND A DISPLAY DEVICE

(71) Applicants: BOE TECHNOLOGY GROUP CO., LTD., Beijing (CN); Hefei Xinsheng Optoelectronics Technology Co., Ltd., Hefei, Anhui (CN)

(72) Inventors: Binbin Cao, Beijing (CN); Hui Zhang, Beijing (CN); Li Ai, Beijing (CN)

(73) Assignees: BOE TECHNOLOGY GROUP CO., LTD., Beijing (CN); Hefei Xinsheng Optoelectronics Technology Co., Ltd., Hefei, Anhui (CN)

( * ) Notice: Subject to any disclaimer, the term of this patent is extended or adjusted under 35 U.S.C. 154(b) by 0 days.

(21) Appl. No.: 16/107,884

(22) Filed: Aug. 21, 2018

(65) Prior Publication Data
US 2019/0131317 A1    May 2, 2019

(30) Foreign Application Priority Data
Oct. 27, 2017    (CN) .......................... 2017 1 1024949

(51) Int. Cl.
| H01L 27/12 | (2006.01) |
| G09G 3/20 | (2006.01) |
| H01L 27/32 | (2006.01) |
| G02F 1/1362 | (2006.01) |
| H01L 51/52 | (2006.01) |

(52) U.S. Cl.
CPC .......... *H01L 27/124* (2013.01); *G02F 1/1362* (2013.01); *G09G 3/20* (2013.01); *H01L 27/1262* (2013.01); *H01L 27/3258* (2013.01); *G02F 2001/136254* (2013.01); *H01L 51/5237* (2013.01)

(58) Field of Classification Search
None
See application file for complete search history.

(56) References Cited

U.S. PATENT DOCUMENTS 9,761,731 B2* 9/2017 Long .................. H01L 29/786
2014/0131715 A1* 5/2014 Liu ................... H01L 27/1218
257/59

* cited by examiner

*Primary Examiner* — Michelle Mandala
(74) *Attorney, Agent, or Firm* — Foley & Lardner LLP (57) ABSTRACT

A method for manufacturing an array substrate, including forming at least two data lines, forming a buffer layer on the data lines, forming an organic film, which is provided with vias, on the buffer layer, the vias being in a partially overlapping relationship with the orthographic projection of the two adjacent data lines on a base substrate, forming a first conductive layer on the organic film.

9 Claims, 11 Drawing Sheets

ARRAY SUBSTRATE, ITS MANUFACTURING METHOD, AND A DISPLAY DEVICE

CROSS REFERENCE

This application is based upon and claims priority to Chinese Patent Application No. 201711024949.5, filed on Oct. 27, 2017, the entire contents thereof are incorporated herein by reference.

TECHNICAL FIELD

The present application relates to the field of display technique, in particular to an array substrate, its manufacturing method, and a display device.

BACKGROUND

By using an organic film process, the coupling capacitance between a data line and a common electrode can be effectively reduced to enhance the aperture ratio of product such that the power consumption of product of a thin film transistor liquid crystal display is reduced, which has been very widely used in recent years.

SUMMARY

According to some arrangements, a method for manufacturing an array substrate includes forming at least two data lines, forming a buffer layer on the data lines, forming an organic film, which is provided with vias, on the buffer layer, the vias being in a partially overlapping relationship with the orthographic projection of the two adjacent data lines on a base substrate, and forming a first conductive layer on the organic film.

In an exemplary arrangement of the present disclosure, in the method, forming at least two data lines includes forming extension regions, which are faced to each other, are respectively formed in the two adjacent data lines. The vias are in an overlapping relationship with the orthographic projection of the extension regions on the base substrate.

In an exemplary arrangement of the present disclosure, in the method, before the data lines are formed, a gate layer is formed on the base substrate, and a gate insulating layer is formed on the gate layer, and an active layer is formed on the gate insulating layer.

In an exemplary arrangement of the present disclosure, the method further includes forming a source drain electrode on the active layer at the same time that the data lines are formed on the active layer, and a buffer layer is formed on the data lines, the source drain electrode and the active layer.

In an exemplary arrangement of the present disclosure, in the method, after a first conductive layer is formed on the organic film, a passivation layer is formed on the first conductive layer, and a second conductive layer is formed on the passivation layer.

In an exemplary arrangement of the present disclosure, in the method, said at least two data lines and the vias, which are formed in the organic film, are arranged in a dummy pixel region.

In an exemplary arrangement of the present disclosure, in the method, said at least two data lines and the vias, which are formed in the organic film, are arranged in a dummy pixel region.

In an exemplary arrangement of the present disclosure, in the method, said at least two data lines and the vias, which are formed in the organic film, are arranged in a dummy pixel region.

In an exemplary arrangement of the present disclosure, in the method, said at least two data lines and the vias, which are formed in the organic film, are arranged in a dummy pixel region.

According to some arrangements, the present disclosure provides an array substrate, including a buffer layer, an organic film, a first conductive layer and a plurality of pixel detection units. The organic film is on the buffer layer, and the first conductive layer is on the organic film. The pixel detection unit includes at least two data lines. The buffer layer is on the data lines. Vias on the organic film. The vias are in a partially overlapping relationship with the orthographic projection of the two adjacent data lines on the base substrate.

In an exemplary arrangement of the present disclosure, the data line includes an extension region, and the extension regions of the adjacent data lines are arranged to face each other, and the vias are in an overlapping relationship with the orthographic projection of the extension regions on the base substrate.

In an exemplary arrangement of the present disclosure, the array substrate further includes a gate layer that is on the base substrate; a gate insulating layer that is on the gate layer; an active layer that is on the gate insulating layer. The data lines are on the active layer.

In an exemplary arrangement of the present disclosure, the array substrate further includes a source drain electrode that is on the active layer. The buffer layer is on the data lines. The source drain electrode and the active layer.

In an exemplary arrangement of the present disclosure, the array substrate further includes a passivation layer that is on the first conductive layer; and a second conductive layer that is on the passivation layer.

In an exemplary arrangement of the present disclosure, the pixel detection units are arranged in the dummy pixel region.

According to some arrangements, a display device includes the array substrate as described above.

BRIEF DESCRIPTION OF THE DRAWINGS

Other features, objects and advantages of the present application will become apparent upon reading the following detailed description of the non-limiting arrangements and with reference to the accompanied drawings.

DETAILED DESCRIPTION

The organic film of the related art may be decomposed during use to contaminate the adjacent film layer structures. In order to solve this problem, a buffer layer is generally arranged under the organic film. There is a quality risk of product since a buffer layer is not formed due to equipment malfunction or errors. Therefore, it is necessary to detect the absence in the buffer layer in time.

In view of the above defects or deficiencies in the related art, it is expected to provide an array substrate, its manufacturing method and a display device, by which a product with poor quality that is caused by absence in a buffer layer under an organic film can be detected to avoid product quality risk.

A array substrate, its manufacturing method and a display device provided in the arrangements of the present disclosure can detect the problem of the absence in the buffer layer to avoid the risk of product quality by arranging vias in the organic film to cover adjacent data lines such that a first conductive layer can short the adjacent data lines by means of vias when the buffer layer fails to be formed, to detect signals of adjacent data lines during the detection of the array.

An array substrate, its manufacturing method and a display device provided by some arrangements of the present disclosure can achieve the following, i.e., the data lines including extension regions are arranged in such a way that the extension regions of the adjacent data lines are arranged to be faced to each other to reduce the scope covered by the vias in the organic film, so as to reduce the area of the vias, thus avoiding the risk of the product performance instability caused by the vias that needs cover a relatively large range.

An array substrate, its manufacturing method and a display device provided by some arrangements of the present disclosure can avoid affecting a normal pixel region without changing the manufacturing process of the normal pixel region by arranging the pixel detection units in a dummy pixel region.

Further details of the present application are further provided below in conjunction with the drawings and arrangements. It will be appreciated that the specific arrangements described herein are only used for explaining the relevant invention, not for limiting the invention. In addition, for convenience of description, only the content relevant to the present application is shown.

It should be noted that, the arrangements of the present application and the characteristics of the arrangements can be mutually combined under the condition of no conflict. The present application will be described in detail below with reference to the drawings and in conjunction with arrangements.

FIG. 1A-1F are schematic flowchart of the production process of an array substrate containing an organic film of a related technique. As shown in FIGS. 1A-1F, the production process includes six mask processes on the base substrate 100. The mask processes successively include the flowing: a gate 101 (Gate), a gate insulating layer 102, a source drain electrode 104 (SDT), the organic film 106 (ORG), a first conductive layer 107 (1st ITO), a passivation layer 108 (PVX2) and a second conductive layer 109 (2st ITO). Before the organic film 106 is coated, it is necessary to form a buffer layer 105 on the source drain electrode 104. The buffer layer 105 is configured to prevent performance degradation and picture quality degradation of the display device, which are caused by the pollution of the active layer 103 due to C, O, S, H and other elements after the organic film 106 is decomposed under the action of a backlight and current during a long-time use.

In the organic film process as shown in FIGS. 1A-1F, when the buffer layer 105 fails to be formed due to equipment abnormality or process error, the existing detection method of array segment cannot recognize this defect. The existing electrical and optical detection methods cannot recognize the defect either. Therefore, the defect caused by the above reasons can be only recognized by the follow-up trust evaluation or the clients during the long-term use, resulting in that the products manufactured by the process have a great quality risk.

Figure 1A:
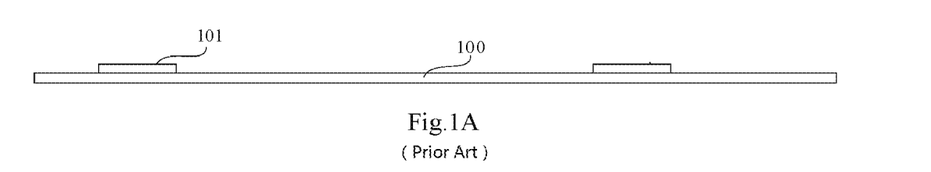
FIG. 1A-1F are schematic flowchart of the production process of an array substrate containing an organic film of a related technique.
Figure 1B:
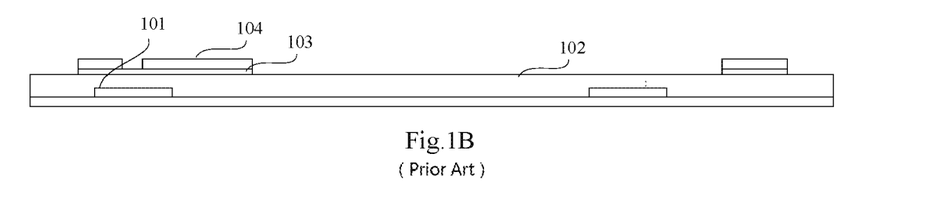
Figure 1C:
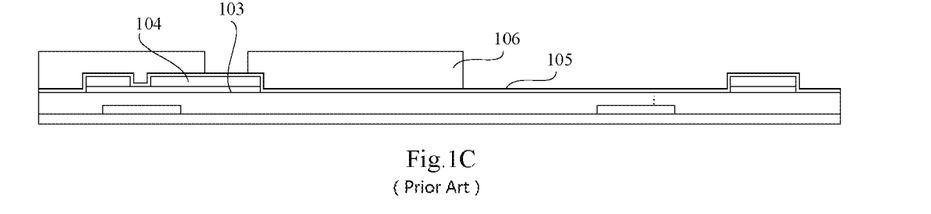
Figure 1D:
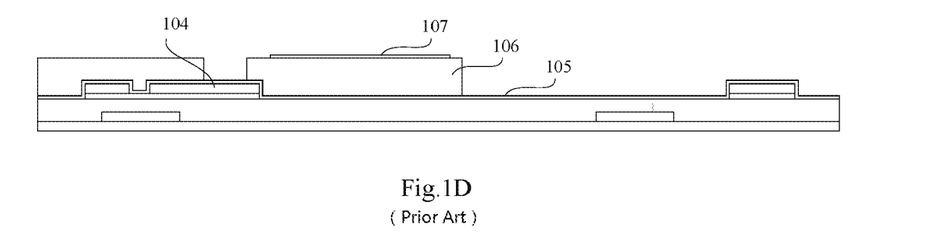
Figure 1E:
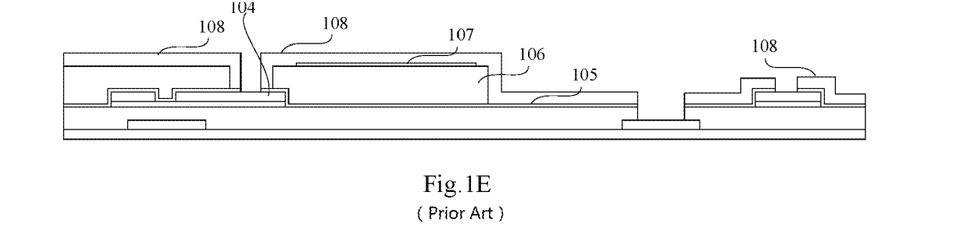
Figure 1F:
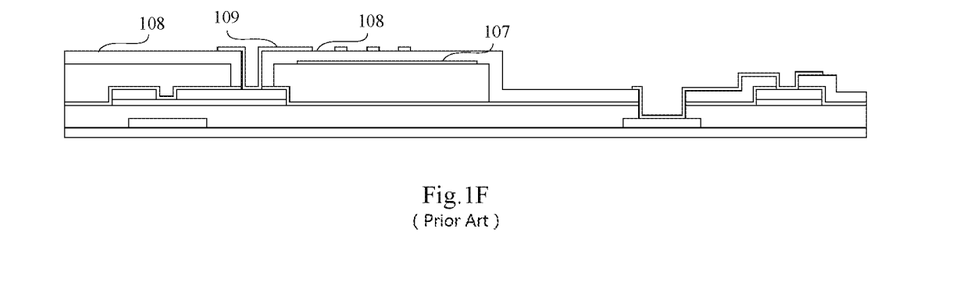
Figure 2:
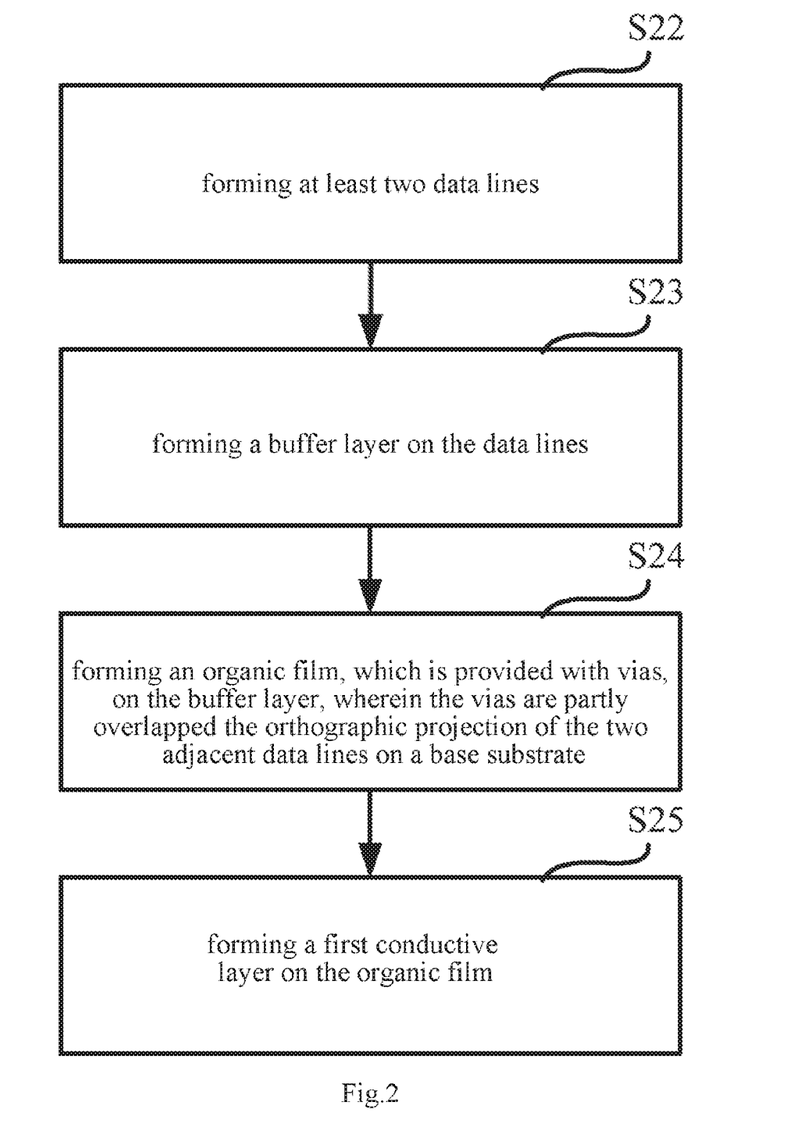
FIG. 2 is a flowchart for arranging pixel detection units in an array substrate manufacturing method provided by an arrangement of the present disclosure.

FIG. 2 is a flowchart for arranging pixel detection units in an array substrate manufacturing method provided by an arrangement of the present disclosure. As shown in FIG. 2, in the present arrangement, the array substrate manufacturing method according to the present disclosure includes:

S22: forming at least two data lines;

S23: forming a buffer layer on the data lines;

S24: forming an organic film, which is provided with vias, on the buffer layer. The vias are in a partially overlapping relationship with the orthographic projection of the two adjacent data lines on the base substrate;

S25: forming a first conductive layer on the organic film,

When the buffer layer fails to be formed, the first conductive layer shorts the adjacent data lines through the vias.

Therefore, a plurality of pixel detection units are on the array substrate. The pixel detection unit includes at least two data lines, the buffer layer being on the data lines, and vias on the organic film. The vias are in a partially overlapping relationship with the orthographic projection of the two adjacent data lines on the base substrate.

In particular, in the present arrangement, the conductive layer is made of indium-tin oxide (ITO). In further arrangements, the conductive layer can be made of different materials according to actual needs.

In the present arrangement, the manufacturing method of the normal pixels adopts the organic film process as shown in FIGS. 1A-1F. S23 for arranging the pixel detection units adopts the same process as that for forming the buffer layer of the normal pixels, i.e., adopting any one of depositing, coating, and sputtering, and is omitted for brevity.

The difference between S24 and the method for manufacturing the normal pixels lies in that the vias covering the adjacent data lines are arranged in the organic film, such that when the buff layer is successfully formed in S23, a first conductive layer that is formed in S25 covers the buffer layer formed on the adjacent data lines by means of the vias; and when the buffer layer fails to be formed in S23, the short connection is formed between the adjacent data lines by means of the vias that directly cover the adjacent data lines.

Therefore, when the buffer layer that is formed in S23 fails to be formed to cause the absence in the buffer layer, i.e., the direct digital synthesis signal (called as DDS for short) for short circuit of the adjacent data lines can be detected in the array detection, thus detecting the problem of the absence in the buffer layer.

Figure 3:
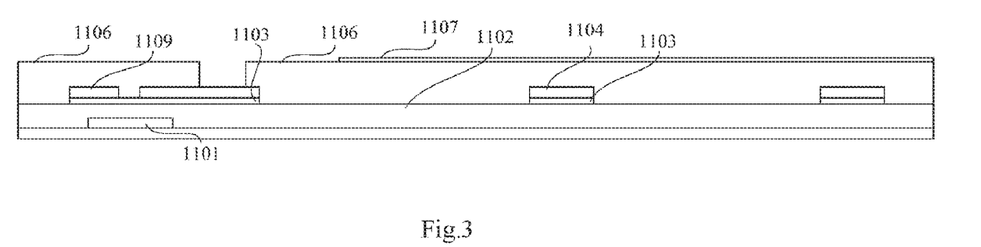
FIG. 3 is a schematic structural view of the normal pixels when a buffer layer fails to be formed.
Figure 4:
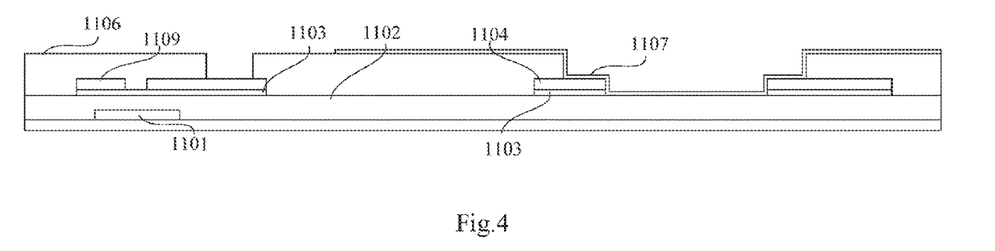
FIG. 4 is a schematic structural view of a pixel detection unit when a buffer layer fails to be formed.

FIG. 3 is a schematic structural view of the normal pixel when a buffer layer fails to be formed. FIG. 4 is a schematic structural view of a pixel detection unit when a buffer layer fails to be formed.

As shown in FIGS. 3 and 4, for the normal pixel, when the buffer layer fails to be formed, the first conductive layer 1107 is spaced from the data line 1104 by the organic film 1106, and thus there is not a short connection formed between the adjacent data lines.

For the pixel detection unit, when the buffer layer fails to be formed, the first conductive layer 1107 is connected with the data line 1104 through a via in the organic film 406, such that a short circuit is formed between the adjacent data lines. Therefore, products with poor quality caused by absence in the buffer layer can be detected when the array detection is carried out.

In the present arrangement, the pixel detection units are arranged in a dummy pixel region. Specifically, the dummy pixel region refers to pixels that are additionally arranged around the normal pixels on the array substrate, which are usually called dummy pixels. In more arrangements, the pixel detection units can be arranged in different positions of the normal pixel region and the like of the array substrate according to actual requirements, and other different organic film processes are configured for the normal pixels to achieve the same technical effect.

In the above arrangements, the problem of the absence in the buffer layer can be detected to avoid the risk of product quality by arranging vias in the organic film to cover adjacent data lines such that a first conductive layer can short the adjacent data lines by means of vias when the buffer layer fails to be formed, to detect signals of adjacent data lines during the array detection.

Figure 5:
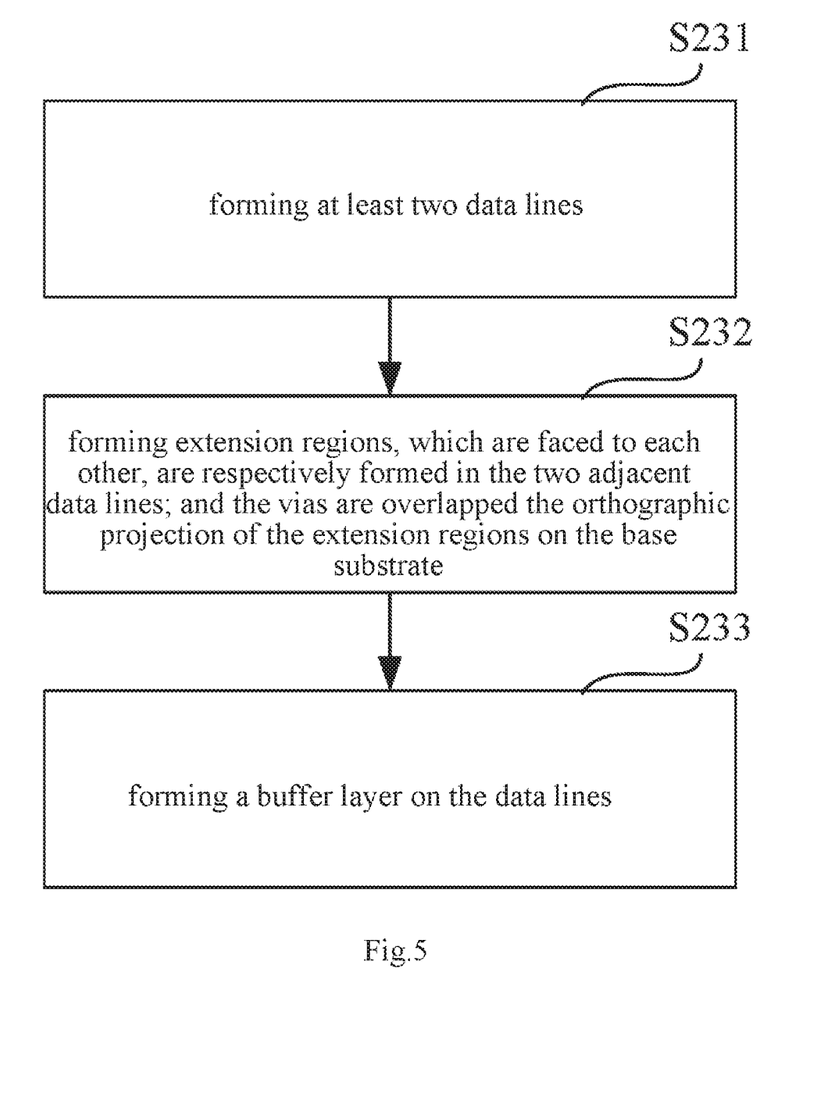
FIG. 5 is a flowchart of an arrangement for arranging a pixel detection unit of FIG. 2.

FIG. 5 is a flowchart of an arrangement for arranging pixel detection units of FIG. 2.

Figure 6:
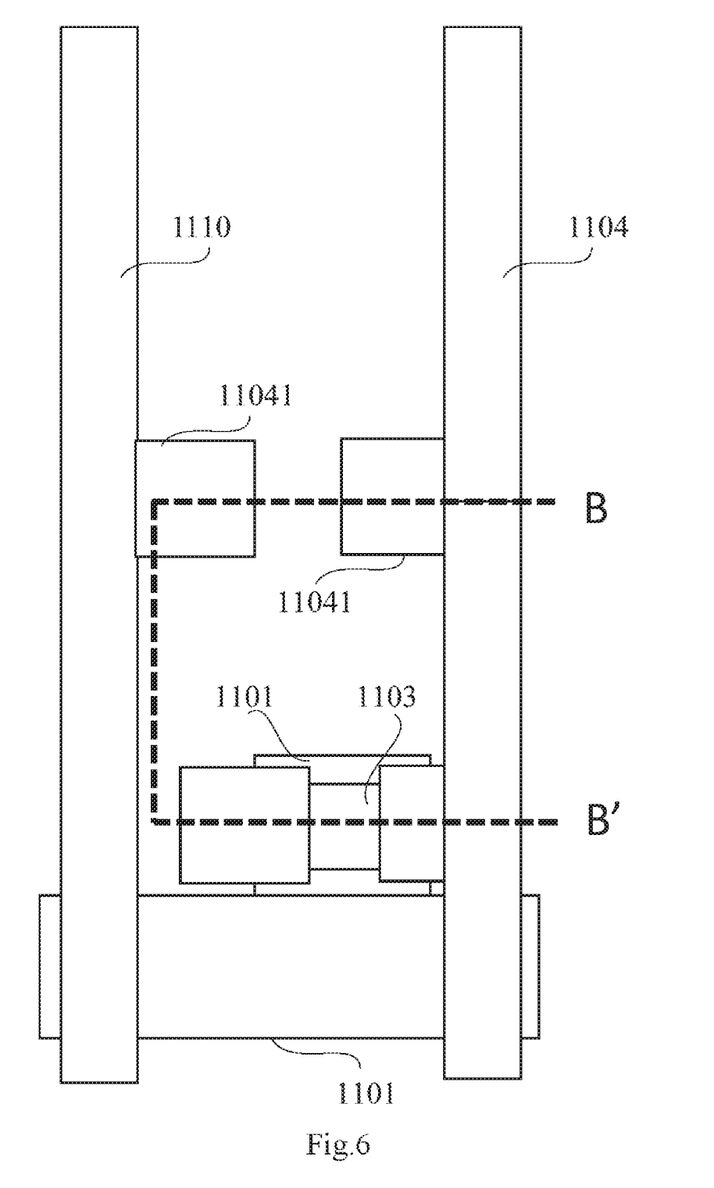
FIG. 6 is a schematic top view of the pixel detection unit after the mask process of the source drain electrode is completed in an arrangement of the present disclosure.
Figure 7:
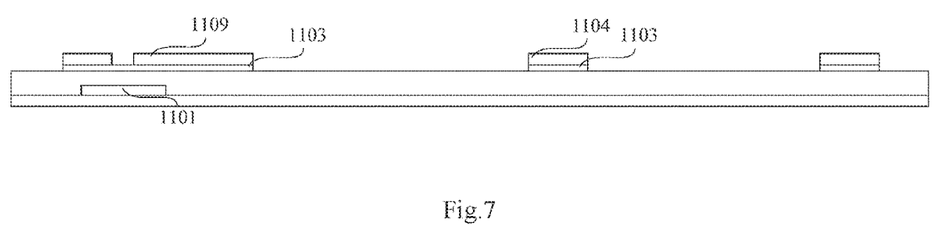
FIG. 7 shows a schematic section view taken along B-B' of a schematic top view of FIG. 6.
Figure 8:
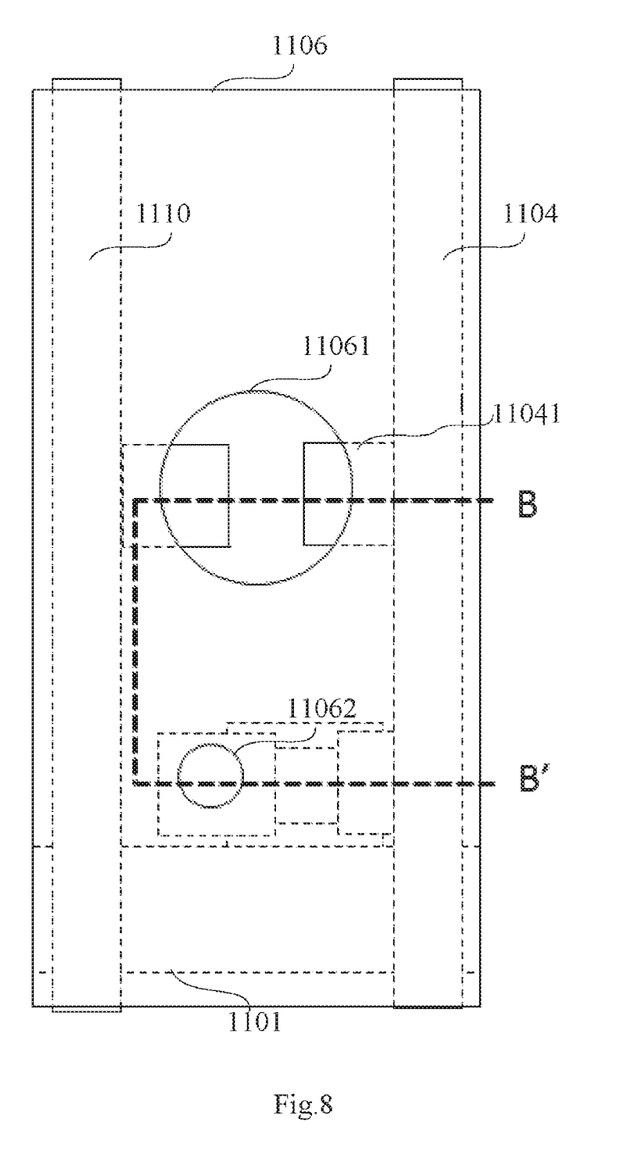
FIG. 8 is a schematic top view of the pixel detection unit after the mask process of the organic film is completed in an arrangement of the present disclosure.
Figure 9:
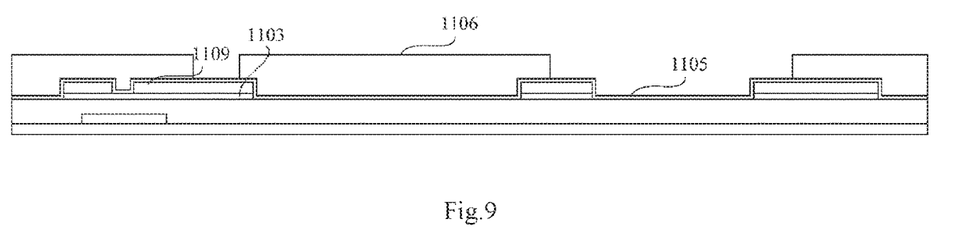
FIG. 9 shows a schematic section view taken along B-B' of a schematic top view of FIG. 8.

As shown in FIG. 5, in an arrangement, in the manufacturing method of the array substrate provided by the present disclosure, S23 includes:

S231: forming at least two data lines;

S232: forming extension regions, which are faced to each other, are respectively formed in the two adjacent data lines; and the vias are in an overlapping relationship with the orthographic projection of the extension regions on the base substrate; and S233: forming a buffer layer on the data lines;

FIG. 6 is a schematic top view of the pixel detection unit after the mask process of the source drain electrode is completed in an arrangement of the present disclosure. FIG. 7 shows a schematic section view taken along B-B' of a schematic top view of FIG. 6. FIG. 8 is a schematic top view of the pixel detection unit after the mask process of the source drain electrode is completed in an arrangement of the present disclosure. FIG. 9 shows a schematic section view taken along B-B' of a schematic top view of FIG. 8.

As shown in FIGS. 6-9, in the method provided in FIG. 5, because in S232 the extension regions 11041 that are faced to each other are arranged for the adjacent data lines, the vias arranged in S24 are not needed to cover the adjacent data lines themselves, but are only needed to cover the extension regions of the adjacent data lines that are faced to each other, thus reducing the area that is needed to be covered by the vias.

As shown in FIG. 8, in the arrangement, the extension region 11041 is rectangular, and the via 11061 is circular. Further, also as shown in FIG. 8, except that the via 11061 is on the organic film 806, a second via 11062 is also on the organic film and configured for a connection electrode to pass through the second via 11062 to connect the drain electrode and a pixel electrode. In more arrangements, the extension region and the via can be arranged to be oval, triangular and irregular or the like, which can achieve the same technical effect, according to actual requirements.

In the above arrangements, the data lines including extension regions are arranged in such a way that the extension regions of the adjacent data lines are arranged to face each other to reduce the scope covered by the vias in the organic film, so as to reduce the area of the vias, thus avoiding the risk of the product performance instability caused by the vias that needs cover a relatively large range.

In an arrangement, before S22, the method further includes the following.

A gate layer is formed on the base substrate 100, and a gate insulating layer is formed on the gate layer, and an active layer is formed on the gate insulating layer.

For example, S22 further includes: forming a source drain electrode on the active layer at the same time that the data lines are formed on the active layer, and in S23, a buffer layer is formed on the data lines, the source drain electrode and the active layer.

Also for example, after S25, the method further includes forming a passivation layer (PVX2 mask) on the first conductive layer, and a second conductive layer (2st ITO mask) is formed on the passivation layer. In particular, a method for carrying out this process is the same as conventional process, and is omitted for brevity.

Figure 10:
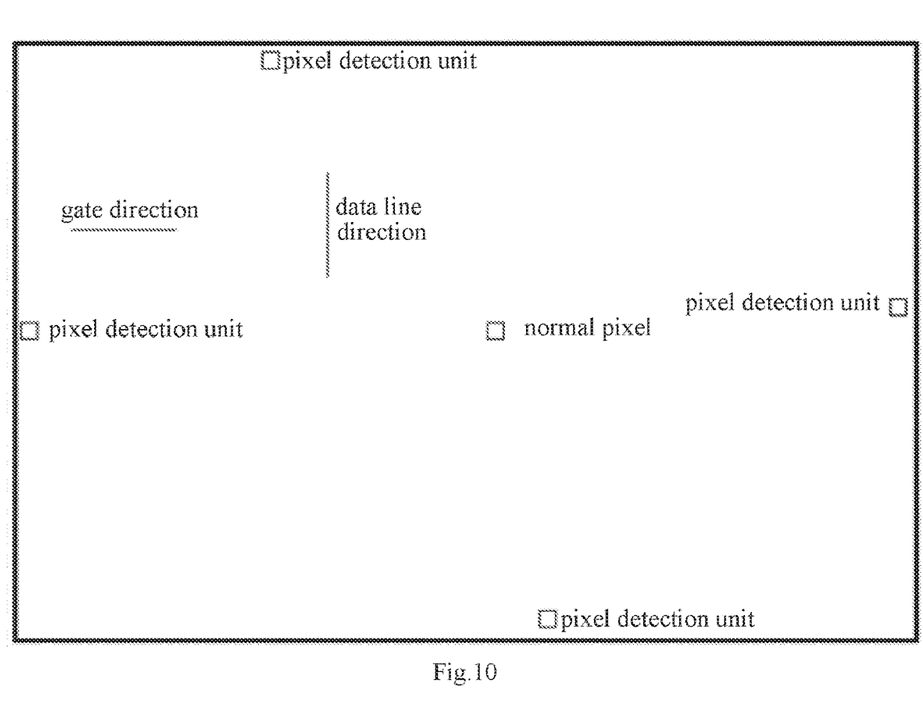
FIG. 10 is a schematic structural view of an array substrate provided by an arrangement of the present disclosure.

FIG. 10 is a schematic structural view of an array substrate provided by an arrangement of the present disclosure. As shown in FIG. 10, the array substrate can be obtained by the method for manufacturing an array substrate provided according to any one of the above arrangements.

Figure 11:
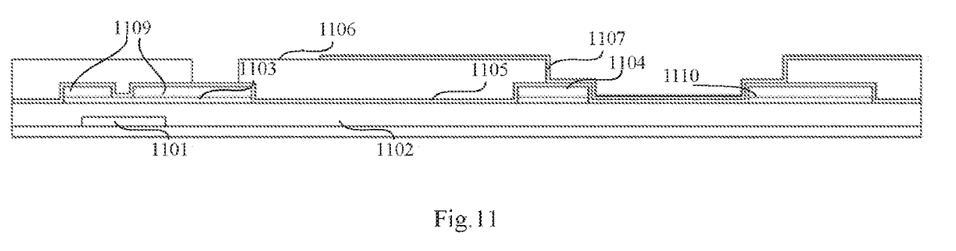
FIG. 11 is a schematic structural view of a pixel detection unit in an array substrate of FIG. 10 when a buffer layer is successfully formed.

FIG. 11 is a schematic structural view of a pixel detection unit in an array substrate of FIG. 10 when a buffer layer is successfully formed.

As shown in FIGS. 10 and 11, in the present arrangement, the disclosure provides an array substrate which is provided with a plurality of pixel detection units. The pixel detection unit includes:

data lines 1104 and 1110, on which a buffer layer 1105 is arranged; and vias provided on an organic film 1106. The organic film 1106 is on the buffer layer 1105, and the vias cover the adjacent data lines.

A first conductive layer 1107 is on the organic film 1106. When there is absence in the buffer layer 1105, the first conductive layer 1107 shorts the adjacent data lines through the vias in the organic film 1106.

Specifically, the pixel detection unit structure as shown in FIG. 11 is the pixel detection unit structure when the buffer layer is formed successfully, and when the buffer layer fails to be formed the pixel detection unit structure can be referred to FIG. 4.

The principle of detecting the absence due to the failure in forming the buffer layer can be referred to the method described in conjunction with FIG. 2, and is omitted for brevity.

In an arrangement, the data line includes an extension region, and the extension regions of the adjacent data lines are arranged to face each other so as to be covered by the vias. The array substrate provided by the arrangement can be obtained by means of the method shown in FIG. 5, which has a structure that can be referred to in FIGS. 6-9 for details, and is omitted for brevity.

In an arrangement, the array substrate further includes:

a gate layer 1101 that is on the base substrate;

a gate insulating layer 1102 that is on the gate layer 1101;

an active layer 1103 that is on the gate insulating layer 1102;

the data lines 1104 and 1110 are on the active layer 1103.

For example, the array substrate further includes a source drain electrode 1109 on the active layer 1103. The buffer layer 1105 is on the data lines 1104 and 1110, the source drain electrode 1109 and the active layer 1103.

Also for example, the array substrate further includes:

a passivation layer (not shown in the drawings) that is on the first conductive layer 1107; and a second conductive layer (not shown in the drawings) that is on the passivation layer.

The structure of the passivation layer and the second conductive layer may be referred to the passivation layer 108 and the second conductive layer 109 in the process as shown in FIGS. 1A-1F, and is omitted for brevity.

In an arrangement, the pixel detection units are arranged in a dummy pixel region. In more arrangements, the pixel detection units can be arranged in different areas of the array substrate according to actual requirements.

In the above arrangements, the pixel detection units are arranged in the dummy pixel region to avoid affecting the normal pixel region, without changing the manufacturing process of normal pixel region.

The disclosure also provides a display device, including the array substrate as described in any one of the above arrangements. The display device may be: a liquid crystal panel, an electronic-paper, OLED panel, a mobile phone, a tablet computer, a television, a monitor, a notebook computer, a digital photo frame, a navigator, and any other product or component having a display function.

The flowchart and the diagram in the drawings illustrate the architectures, functions, and operations that can be implemented according to systems, methods, and computer program products that are disclosed in various arrangements. At this point, each block in the flowchart or the diagram can represent a module, a program segment, or a part of the codes that contain one or more executable instructions for implementing the specified logical functions. It should be also noted that in some implementations as replacements, the functions that are marked in the block can also occur in a different order than those in the accompanied drawings. For example, two blocks in succession may in fact be substantially executed in parallel, and they may sometimes be executed in the reverse order, depending on the functionality involved. It should be also noted that each block in the diagram and/or the flowchart and combinations of the blocks of the diagram and/or the flowchart can be achieved by a specified hardware-based system performing predetermined functions or operations, or by combinations of specified hardware and computer instructions.

The units or modules described in the arrangement of this application can be implemented by means of software or by means of hardware. The described unit or module can also be arranged in the processor, for example, each unit can be a software program that is arranged in a computer or mobile smart device, or can be a separately configured hardware device. The names of these units or modules do not, in some cases, constitute a limit to the unit or module itself.

The above description only relates to arrangements and depiction of the technical principles to be applied. Those skilled in the art should understand that, the scope of the present disclosure is not limited to the technical solutions achieved by the particular combinations of the above features and is covered by the technical solutions formed by the technical features or any combination of the equivalent technical features, without departing from the concepts of the present application. For example, the solutions which are achieved by replacing the above features with the technical features that are disclosed in (but not limited to) the present application and have similar functions.

What is claimed is:

1. A method for manufacturing an array substrate, comprising:

forming at least two data lines;

forming a buffer layer on the at least two data lines;

forming an organic film, which is provided with vias, on the buffer layer, wherein the vias are in a partially overlapping relationship with an orthographic projection of two adjacent data lines of the at least two data lines on a base substrate; and forming a first conductive layer on the organic film.

2. The method according to claim 1, wherein forming the at least two data lines comprises:

forming extension regions facing each other, the extension regions are respectively formed in the two adjacent data lines; wherein the vias are in an overlapping relationship with the orthographic projection of the extension regions on the base substrate.

3. The method according to claim 1, wherein before the at least two data lines are formed, a gate layer is formed on the base substrate, and a gate insulating layer is formed on the gate layer, and an active layer is formed on the gate insulating layer.

4. The method according to claim 3, further comprising:

forming a source drain electrode on the active layer at the same time that the at least two data lines are formed on the active layer, and the buffer layer is formed on the at least two data lines, the source drain electrode and the active layer.

5. The method according to claim 1, wherein after the first conductive layer is formed on the organic film, a passivation layer is formed on the first conductive layer; and a second conductive layer is formed on the passivation layer.

6. The method according to claim 1, wherein the at least two data lines and the vias, which are formed in the organic film, are arranged in a dummy pixel region.

7. The method according to claim 2, wherein the at least two data lines and the vias, which are formed in the organic film, are arranged in a dummy pixel region.

8. The method according to claim 4, wherein the at least two data lines and the vias, which are formed in the organic film, are arranged in a dummy pixel region.

9. The method according to claim 5, wherein the at least two data lines and the vias, which are formed in the organic film, are arranged in a dummy pixel region.

* * * * *